United States Patent [19]

Novembre

[11] Patent Number: 5,066,566

[45] Date of Patent: Nov. 19, 1991

[54] RESIST MATERIALS

[75] Inventor: Anthony E. Novembre, Union, N.J.

[73] Assignee: AT&T Bell Laboratories, Murray Hill, N.J.

[21] Appl. No.: 560,517

[22] Filed: Jul. 31, 1990

[51] Int. Cl.$^5$ .................... G03F 7/039; G03F 7/32; G03F 7/36

[52] U.S. Cl. .................... 430/296; 430/967; 430/330; 430/326; 430/313; 430/325; 430/323; 430/270; 156/643

[58] Field of Search ............ 430/296, 967, 330, 326, 430/313, 323, 325; 156/643

[56] References Cited

U.S. PATENT DOCUMENTS

| | | | |
|---|---|---|---|
| 4,491,628 | 1/1985 | Ito et al. | 430/325 X |
| 4,842,986 | 6/1989 | Matsuda et al. | 430/296 X |
| 4,883,740 | 11/1989 | Schwalm et al. | 430/330 X |

OTHER PUBLICATIONS

R. G. Tarascon, et al., *Proceedings of Regional Technical Conference* on Photopolymers, Principles, Processes and Materials, Mid Hudson Section, Society of Plastic Engineers, Oct. 30 to Nov. 2, 1988, Ellenville, N.Y., p. 11.
G. N. Taylor, et al., *Journal of the Electrochemical Society*, 131, 1654 (1984).
M. J. Bowden, *Materials for Microlithography*, ed. L. F. Thompson, et al., ACS Symposium Series, No. 266, American Chemical Society, Washington, D.C., 1984, p. 49.
Billmeyer, *Textbook of Polymer Science*, p. 6, 1971, J. Wiley & Sons.
G. Odian, *Principles of Polymerization*, 2nd ed., Wiley-Interscience (1981), Table of Contents.
K. Ivan and J. B. Rose, *Advances in Macromolecular Chemistry*, 1, 335 (1968).
G. Odian, supra, p. 268.
*Introduction to Microlithography*, eds. L. F. Thompson, et al., ACS Symposium, Series 219 (1983).
Tarascon et al., "Poly(tert-butoxycarbonylstyrene Sulfone)-Based Chemically Amplified Resists for Deep-UV Lithography", from *Chemical Abstracts*, vol. 111, No. 164013t, Citing *Polym Eng. Sci.*, 1989, vol. 29, No. 13, pp. 850–855.
Houlihan et al, "Chemically Amplified Resists Effects of Polymer and Acid Generator Structure", from *Chemical Abstracts*, vol. 112, No. 45457b, citing *ACS Symp. Ser.*, 1989, 412 (Polym. Microlithogr.), 39–56.

*Primary Examiner*—Cynthia Hamilton
*Attorney, Agent, or Firm*—B. S. Schneider

[57] ABSTRACT

A one component resist material useful for deep ultraviolet, x-ray, and electron radiation has been found. Such material involves a substituent that is sensitive to acid and a moiety in the chain which both induces scission and provides an acid functionally upon such scission.

9 Claims, No Drawings

RESIST MATERIALS

BACKGROUND OF THE INVENTION

1. Field of the Invention

This invention relates to lithographic processes, and in particular, to lithographic processes involving device fabrication.

2. Art Background

Lithographic processes are typically employed in the manufacture of devices such as semiconductor devices. Among the lithographic processes that are available, photolithography is often utilized. Photolithographic processes have the advantage of being suitable for a blanket exposure technique. That is, a material that is sensitive to the exposing light is coated onto a substrate, e.g., a silicon wafer, that is being processed to form a plurality of devices. The coating material, i.e., the resist, is then subjected to light that has been passed through a mask material so that the light reaching the resist corresponds to a desired pattern that is to be transferred into the underlying substrate. Since the exposure occurs simultaneously over an entire device or a number of devices being processed on a substrate, e.g., a silicon substrate, the procedure is considered a blanket exposure.

A blanket exposure procedure is advantageous because it is relatively fast compared to other methods such as the raster scan technique usually employed when the energy used to expose the resist is a beam of electrons. However, generally, resolution obtainable through a blanket exposure with ultraviolet or visible light is somewhat poorer than that achieved with other methods such as electron lithography.

Improved resolution with a blanket exposure is achievable by using deep ultraviolet or x-ray light. X-ray exposure generally has a potential for better resolution than exposure with deep ultraviolet light, but has not been studied as extensively. One approach to a photoresist sensitive to deep ultraviolet radiation employs a compound that produces an acid moiety upon irradiation with such radiation together with a polymer that reacts with the generated acid. Typical acid generator/acid sensitive polymer combinations include an onium salt as the photosensitive acid generator and a polymer such as poly(4-t-butoxycarbonyloxystyrene) as the polymer having a reactive substituent. (See Ito, et al. U.S. Pat. No. 4,491,628 dated Jan. 1, 1985.) Such systems are generally referred to as chemical amplification systems since the production of one molecule of acid by actinic radiation induces a reaction in a plurality of molecules in the acid sensitive polymer.

To enhance the sensitivity of acid generator/polymer combination one proposal employs a polymer including both a substituent sensitive to acid and a moiety present in the polymer chain that induces upon irradiation chain scission with associated decrease in molecular weight. As described by R. G. Tarascon, et al, *Proceedings of Regional Technical Conference on Photopolymers, Principles, Processes and Materials*, Mid Hudson Section, Society of Plastic Engineers, Oct. 30 to Nov. 2, 1988, Ellenville, N.Y., page 11, one such combination includes an acid generator and a polymer having a sulfone moiety in the backbone. Although this combination gives excellent results, the presence of more than one material in the resist does add processing and preparation complications.

SUMMARY OF THE INVENTION

It is possible to formulate a single material resist by employing an acid sensitive polymer including a moiety in the backbone that undergoes scission upon irradiation with electrons, x-rays, or deep ultraviolet radiation and which upon such scission produces an acid moiety. This acid moiety in turn induces a chemical reaction with the acid sensitive substituent and produces a chemically amplified reaction. Exemplary of suitable materials for such a resist is poly(4-t-butoxycarbonyloxystyrene-sulfone). A portion of this material upon irradiation undergoes scission to form one sulfonic or sulfinic acid end group at the scission site. The acid in turn when heated reacts relatively rapidly with the 4-tertiary butoxycarbonyloxy moiety in a chemical amplification mode. As a result, a phenolic moiety that is soluble in an aqueous developer is produced. The material is relatively sensitive, e.g. having an exemplary x-ray sensitivity of 15 to 50 mJ/cm$^2$.

DETAILED DESCRIPTION

The materials of the invention are useful in electron and photolithographic processes involving exposure with deep ultraviolet light (light with wavelengths in the range of 190 to 260 nm) x-rays (with wavelengths in the range of 4 to 150 Å) and electrons. For x-rays above 30 Å or ultraviolet light below 200 nm, however, the absorption occurs at or just below the the surface of the resist film, and thus surface imaging schemes are employed (see G. N. Taylor, et al., *Journal of the Electrochemical Society*, 131, 1654 (1984)). The materials are useful in the substantial absence of an additional material that produces an acid upon irradiation with such light although there is a tendency to be significantly less sensitive to deep ultraviolet exposure. In particular, the material is chosen so that a moiety is present in the polymer chain that induces scission in the polymer chain under irradiation and as a result of this scission produces an acidic moiety. Exemplary of such materials is poly(4-t-butoxycarbonyloxystyrene-sulfone) which undergoes scission to form lower molecular weight polymers containing sulfonic or sulfinic acid end groups. This acidic medium when the exposed resist is treated with heat, i.e. subjected to a temperature in the range 90° to 150° C. for time periods in the range 30 sec to 4 minutes (on a hot plate) reacts with the acid sensitive substituent of the polymer, e.g. the t-butoxycarbonyloxy substituent in the above example, producing a phenolic moiety.

The concentration of this phenolic moiety and thus the solution rate during development depends both on the number of chain scission producing moieties present and the rate of reaction of the acid sensitive substituent of the polymer with the resulting acid formed after scission of the polymer. The difference in solubility between the exposed and unexposed regions allows the material to be employed both as a negative and positive resist. In the latter case, the exposed region is removed by utilizing a differential solvent for the exposed region that leaves the unexposed region substantially in tact. In the former case, a solvent with the reverse properties are employed.

In either case, if the ratio of the rate of dissolution of the radiation sensitive composition before irradiation compared to that after irradiation is taken as 1:n, n should not be less than 2 and preferably should be more than 10 for a positive image (not more than 0.5 and preferably less than 0.1 for a negative image). Solubility ratios outside this range typically produce low contrast and degraded image quality. The solvent employed in developing negative images is chosen to avoid the production of swelling in the material remaining after solvation and for positive image should not dissolve a substantial thickness of the unexposed region.

Typically in one embodiment to obtain a suitable difference in solubility between exposed and unexposed regions it is generally desirable for materials such

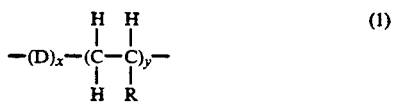

where D is the chain scission moiety such as $(SO_2)$ and where R is the acid sensitive moiety to have x and y in a ratio between 1:1 and 1:10. Exemplary materials include those of equation 1 with R being class (1)

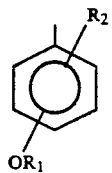

where $—O—R_1$ is, for example, t-alkyl carbonates (t-butoxy carbonyloxy, 2-methyl-3-trimethylsily-2-propanyloxycarbonyloxy or t-amyloxy carbonyloxy) or t-butyl substituents that easily undergo $R_1—O$ bond cleavage in the presence of acid and where $R_2$ is optional but is advantageously chosen to enhance absorption of the exposing radiation, e.g., Cl or Br for x-ray exposure, and is not acidic class (2) $G—O—R_1$ where G is a lower alkyl and $R_1$ is as above and class (3)

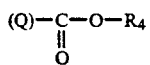

where Q is optional, aryl or lower alkyl, $R_4$ is t-butyl or derivatives thereof, e.g., $—CH(CH_3)—\Phi$ or $—C(CH_3)_2—\Phi$ and where the substituent is not acidic.

Although this material in equation 1 is shown to be a copolymer of D and an unsaturated monomer the notation is meant to include polymers formed from three or more different monomers such that R varies in the polymer chain. Examples include

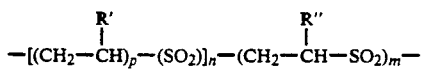

where R' is class (1), (2) or (3) and R" is class (1), (2) or (3) of R as defined above and where n and m are integers. (Some of the R' or R" need not be acid sensitive groups provided sufficient acid sensitivity remains in the polymer. Alternate non-acid sensitive groups include, for example, lower alkyl or aryl.) Additionally, x and y are used to indicate relative proportions of the scission inducing moiety to moieties containing acid sensitive groups and does not imply any ordering in the chain, i.e., the number of moieties and types of moieties between scission inducing moieties need not be the same along the length of the chain. Accordingly, p is chosen in conjunction with the values of n and m to satisfy the constraints on x and y of equation 1. Generally, when R' is a lower alkyl or an ether, then p for synthetic preparation reasons is typically 1.

The scission inducing substituents in the chain are preferably chosen such that upon exposure scission occurs at rates sufficient to exceed a $G_s$ value of approximately one. (See M. J. Bowden, *Materials for Microlithography*, ed. L. F. Thompson, et al., ACS Symposium Series, No. 266, American Chemical Society, Washington, D.C. 1984, p. 49 for a definition of ($G_s$)). A variety of acid sensitive substituents as discussed above are available to yield the desired activity with acid. These substituents are chosen to produce in the presence of acid a carbonium ion that is sufficiently stable to allow the elimination of an available α-hydrogen. The chain scission moiety is not critical provided it is not acidic but produces an acidic substance upon irradiation.

The polymer employed should preferably have a glass transition temperature, $T_g$, that is higher than 30° C. preferably higher than 50° C. If the $T_g$ is substantially lower than 30° C. there is a tendency for the resist to flow during the subsequent processing, thus degrading image processing. The material should form a continuous pinhole free coating which is typically obtained with polymer coating thicknesses in the range 0.3 to 2 μm. In thicker coatings the resolution is generally inferior since the delineation of narrower features results in the production of narrow columns in the developed pattern that tend to deform. Thicker layers for e-beam exposure at typical acceleration voltages and for deep ultraviolet exposure also lead to greater absorption with a resulting degradation in image quality.

For optical exposure, an appropriate optical density in the exposing wavelength range enhances resist quality. Too low an optical density results in less efficient absorption of the exposing radiation and in increased exposure times. In general, it is desirable to employ a material having an optical density that is preferably less than 0.5 for at least 30% of the actinic radiation that reaches the polymer. Optical densities above this range generally do not permit sufficient light to reach the regions of the polymer film furthest removed from the ambient/film polymer interface. The resulting incomplete exposure tends to degrade image quality. The optical density depends on the concentration of the absorbing species in the polymer, and is adjusted by appropriate relative concentration of the constituent monomers forming the polymer. For thicknesses as previously discussed in connection with film continuity, if the desired optical density is maintained useful results are attained.

The resolution and sensitivity over a broad range do not strongly depend on weight average molecular weight of the polymer. (Weight average molecular weight is defined by Billmeyer, *Textbook of Polymer Science*, p. 6, 1971, J. Wiley & Sons.) However, the distribution of the molecular weight, and the relative proportions of the monomers in the polymer do affect resolution and sensitivity. The relative proportion of chain scission inducing moieties compared to moieties containing the acid reactive functional group has been discussed previously. For relatively high sensitivities, it is generally desirable to employ polymers with dispersivities below 10, preferably below 4. (Dispersivity is defined in Billmeyer, supra, p. 6.) Molecular weights greater than $5 \times 10^6$ and dispersivities larger than 10 are not desirable because polymer solubility and resist contrast is reduced, respectively. The molecular weight of the polymer is determined by the polymerization reaction conditions such as initiator, monomer concentration, solvent, and temperature. These parameters are interrelated and a control sample is used to determine the specific conditions necessary to yield the desired molecular weight. (General reaction procedures and conditions for synthesis of materials such as those in equations (1) are given in G. Odian, *Principles of Polymerization*, 2nd ed., Wiley-Interscience (1981). See also co-pending U.S. patent application 316,051 filed Feb. 24, 1989, which is hereby incorporated by reference and K. J. Ivan and J. B. Rose, *Advances in Macromolecular Chemistry*, 1, 335 (1968).) However, typically, for molecular weights in the desired range, the polymers are produced by a free radical solution polymerization technique employing conditions of temperature below the thermodynamic ceiling temperature, a relative mole fraction of chain scission inducing monomer to acid reactive monomer in the range 1:1 to 1:10, a catalyst that decomposes to form an initiator radical such as a free radical, and a concentration of these monomers in the reaction medium adjusted to yield the desired stoichiometry and molecular weight. The solvent should solvate the monomers in the concentration desired, should solvate the polymer product and should not quench the polymerization reaction. (Thermodynamic ceiling temperature is defined by G. Odian, supra, page 268.)

Dispersivity is predominantly dependent on the polymerization technique. To obtain a dispersivity in the desired range, typically, a free radical polymerization is employed. A control sample is used to determine the precise conditions needed for a particularly desired dispersivity.

The resist materials are typically coated onto a substrate, e.g. a semiconductor based wafer such as a silicon wafer that is being processed to form semiconductor devices. A coated wafer is, as previously discussed, subsequently exposed to deep ultraviolet radiation, electrons or x-rays, to delineate a pattern for subsequent processes such as etching (wet or plasma) or metallization that rely on the patterned resist as a mask. During the processing of the semiconductor wafers, it is possible to form the radiation-sensitive body by depositing the resist on a substrate surface that includes a semiconductor material, another polymer, an insulator such as a silicon oxide, a metal, or a combination of these materials. Additionally, it is possible to deposit these materials on substrates such as optical mask blanks, e.g., chromium mask blanks and x-ray mask membranes.

The coating process is conventional. Typically the polymer is dissolved in a suitable solvent such as ethylethoxypropionate, the solution is filtered, and then spin coated onto a wafer. In this manner, films in the thickness range 0.1 to 2.0 μm are produced. After coating it is preferable to prebake the material to remove residual solvent and to enhance adhesion of the resist onto the substrate. Prebaking temperatures in the range 90° to 140° C. for times in the range 10 sec to 60 minutes are desirable. Exposure dose depends on composition and post exposure bake conditions. However, for materials such as that of equation 1 with $x=1$ post exposure baked at 140° C. for 2.5 minutes on a hot plate, when $y=2$ x-ray (4–20 Å) doses in the range 10 to 100 mJ/cm$^2$, when $y=3$ electron doses in the range 60 to 150 μC/cm$^2$ at 40 KeV and when $y=2$ deep ultraviolet doses in the range 1 to 1.5 J/cm$^2$ at 248 nm are appropriate. Conventional exposure techniques such as described in *Introduction to Microlithography*, eds. L. F. Thompson, et al., ACS Symposium, Series 219, (1983) are employed.

The material is post exposure baked to enhance reaction with the acid sensitive substituents. Post exposure bake temperatures in the range 90° to 150° C. for time periods in the range 10 sec to 60 minutes are generally effective. Suitable heating means for this post exposure bake include a convection oven or a hot plate equipped with a vacuum hold-down chuck. The short post exposure bake times of this range are employed with a hot plate heat source. The exposed image is generally developed in a material such as aqueous tetramethyl ammonium hydroxide. Generally immersion in developer for time periods of 20 seconds to 5 min. produces the desired delineation.

The following examples are illustrative of the conditions employed to delineate patterns.

EXAMPLE 1

A 0.5 μm thick film of poly(4-t-butoxycarbonyloxystyrene-sulfone) was spun coated at a spinning speed of 5000 rpm for 2 minutes utilizing an 8.5 w/v % solution in ethylethoxyproprionate. The polymer spun had a composition corresponding to equation 1 with $x=1$, $y=2$, and R is class (1) type with $R_1$ equal to t-butoxy carbonyl and $R_2$ equal to H with a weight average molecular weight of $4.3\times 10^5$ and a dispersivity of 2.1. The silicon wafer before spinning was treated with hexamethyldisilazane at 90° C. for 5 minutes. After spinning, the wafer was baked at 105° C. in air on a hot plate for 2 minutes. The resist was exposed after baking to x-radiation (4 to 20 Å) centered at 14 Å. A series of exposures was performed with exposure doses in the range 10 to 120 mJ/cm$^2$. The wafer, after exposure was post baked at 140° C. for 2.5 minutes in air on a hot plate. Development was accomplished by immersion for 30 seconds in 0.17N tetramethylamonium hydroxide aqueous solution and subsequently rinsed for 20 seconds in deionized water.

The dose required to fully develop and resolve a 100 by 100 μm area was 15 mJ/cm$^2$ and the dose required to fully develop and resolve a 0.4 μm isolated feature was 30 mJ/cm$^2$.

EXAMPLE 2

The procedure of Example 1 was followed except $x=1$ and $y=3$. A series of electron beam exposures was performed on a vector scan system with doses between 30 and 150 μC/cm$^2$ at an acceleration voltage of 40 KeV and a spot current of 1 nA.

The dose required to fully develop and resolve a 0.25 μm line and space pattern was 120 μC/cm$^2$ and the dose required to resolve a 0.50 μm line between two fully developed 10 by 10 μm pads was 80 μC/cm$^2$.

EXAMPLE 3

The procedure of Example 1 was followed except exposure was performed utilizing deep UV radiation (248 nm) and the film thickness was 0.7 μm. A series of exposures with doses in the range 0.5 to 1.5 J/cm$^2$ was performed.

The doses required to fully develop and resolve an area greater than 50 μm$^2$ was approximately 1.25 J/cm$^2$.

I claim:

1. A process of fabricating a device comprising the steps of exposing in a pattern a radiation sensitive material to radiation, developing a pattern in said material and using said pattern in said material as a mask in a subsequent step in said fabricating process characterized in that said radiation sensitive material comprises a polymer having a backbone chain and pendant substituents wherein a moiety is present in said backbone that induces scission of said backbone to form an acid upon said exposure and developing, wherein said substituents react with acid, and wherein there is a substantial absence of an acid generator in said material other than said polymer.

2. The process of claim 1 wherein said radiation comprises electrons.

3. The process of claim 1 where said radiation comprises X-radiation.

4. The process of claim 1 wherein said development comprises baking at elevated temperature followed by treatment with a solvent.

5. The process of claim 1 wherein said moiety is a sulfone functional group.

6. The process of claim 5 wherein said substituent comprises a member chosen from the group consisting of

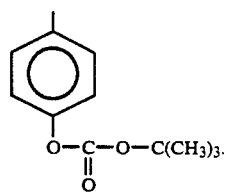

7. The process of claim 1 wherein said substituent comprises a member of the group consisting of

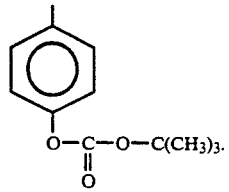

8. The process of claim 1 wherein said polymer comprises a styrenesulfone.

9. The process of claim 1 wherein said subsequent step comprises plasma etching.

* * * * *